United States Patent [19]

Sevier

[11] Patent Number: 6,006,925
[45] Date of Patent: Dec. 28, 1999

[54] EQUIPMENT RACK SYSTEM

[75] Inventor: Richard W. Sevier, Goleta, Calif.

[73] Assignee: Hendry Mechanical Works, Goleta, Calif.

[21] Appl. No.: 09/151,142

[22] Filed: Sep. 10, 1998

Related U.S. Application Data

[63] Continuation-in-part of application No. 08/868,291, Jun. 3, 1997, abandoned.

[51] Int. Cl.$^6$ ........................................ A47F 5/00
[52] U.S. Cl. ........................ 211/26; 211/189; 312/265.4; 361/829
[58] Field of Search .................. 211/26, 189; 312/265.1, 312/265.2, 265.3, 265.4, 265.5; 361/829

[56] References Cited

U.S. PATENT DOCUMENTS

| | | | |
|---|---|---|---|
| D. 326,200 | 5/1992 | Allen et al. ............................. | D6/479 |
| 1,516,711 | 11/1924 | Christell . | |
| 1,957,362 | 5/1934 | Smith ........................................ | 304/5 |
| 2,058,263 | 10/1936 | Rosendale ............................... | 312/143 |
| 2,114,155 | 4/1938 | Streich .................................... | 189/86 |
| 2,386,019 | 10/1945 | Watter ..................................... | 189/36 |
| 2,875,902 | 3/1959 | Ayars, Jr. ................................ | 211/13 |
| 2,950,786 | 8/1960 | Markle ..................................... | 189/1 |
| 2,959,715 | 11/1960 | Leonchick . | |
| 3,160,280 | 12/1964 | Burch ....................................... | 211/59 |
| 3,192,306 | 6/1965 | Skonnord ................................. | 174/16 |
| 3,265,419 | 8/1966 | Durnbaugh et al. ................ | 287/189.36 |
| 3,297,383 | 1/1967 | Fay ......................................... | 312/257 |
| 3,404,931 | 10/1968 | Fall et al. . | |
| 3,420,381 | 1/1969 | Bradfield ................................. | 211/26 |
| 3,537,221 | 11/1970 | Elfman et al. .......................... | 52/289 |
| 3,563,627 | 2/1971 | Whipps .................................. | 312/265.2 |
| 3,907,445 | 9/1975 | Wendt .................................... | 403/232 |
| 3,989,398 | 11/1976 | Wendt .................................... | 403/232 |
| 4,141,054 | 2/1979 | Colaiaco ................................. | 361/333 |
| 4,410,294 | 10/1983 | Gilb . | |
| 4,422,792 | 12/1983 | Gilb ....................................... | 403/232.1 |
| 4,497,411 | 2/1985 | DeBortoli ............................... | 211/26 |
| 4,509,647 | 4/1985 | Sheochuk .............................. | 211/41.17 |
| 4,553,674 | 11/1985 | Yoshikawa et al. ................... | 211/26 |
| 4,572,695 | 2/1986 | Gilb ....................................... | 403/232.1 |
| 4,594,017 | 6/1986 | Hills ........................................ | 403/6 |
| 4,641,987 | 2/1987 | Schlegel ................................. | 403/169 |

(List continued on next page.)

FOREIGN PATENT DOCUMENTS

| | | |
|---|---|---|
| 44-19881 | 8/1969 | Japan . |
| 815777 | 7/1959 | United Kingdom . |
| 983471 | 2/1965 | United Kingdom . |
| 2254962 | 10/1992 | United Kingdom . |

OTHER PUBLICATIONS

Lincoln Electric, "How Welding Simplifies the Design of Brackets," Product Engineering, Nov.1948.

David E. Kosanda, Design and Testing of an Earthquake–Resistant Electronic Equipment Rack, 1987 International Electronics Packaging Conference.

Seismic Simulation Test Program on Two LTS–1565 Equipment Racks, for Rockwell International, by Wyle Laboratories, Feb. 11, 1986.

*Primary Examiner*—Robert W. Gibson, Jr.
*Attorney, Agent, or Firm*—Benoit Law Corporation

[57] ABSTRACT

An equipment rack has horizontal frame structure, and vertical frame structure of sheet material, secured to that horizontal frame structure and having a bent cross-section and opposite ends. The bent cross-section has a square-wave configuration including alternate first, second and third square half-cycle configurations in one piece presenting three substantially flat and mutually spaced crests. The horizontal frame structure extends into more than one of these square half-cycle configurations and along the substantially flat crests of the latter square half-cycle configurations in overlapping relationship with the vertical frame structure substantially for the widths of the crests and for corresponding heights of the horizontal and vertical frame structures. The horizontal and vertical frame structures are intimately interconnected along the above mentioned opposite ends and at all overlapping portions of the horizontal and vertical frame members.

60 Claims, 4 Drawing Sheets

U.S. PATENT DOCUMENTS

| | | | |
|---|---|---|---|
| 4,662,524 | 5/1987 | Fullenkamp et al. | 211/190 |
| 4,664,265 | 5/1987 | George | 211/41.17 |
| 4,690,286 | 9/1987 | Horse et al. | 211/41 |
| 4,715,502 | 12/1987 | Salmon | 211/26 |
| 4,732,281 | 3/1988 | Hall, II | 211/26 |
| 4,899,892 | 2/1990 | Rheault | 211/41 |
| 4,991,061 | 2/1991 | Strange | 361/417 |
| 5,004,107 | 4/1991 | Sevier et al. | 211/26 |
| 5,165,770 | 11/1992 | Hahn | 312/265.4 |
| 5,214,572 | 5/1993 | Cosimanio et al. | 361/415 |
| 5,284,254 | 2/1994 | Rinderer | 211/26 |
| 5,323,916 | 6/1994 | Salmon | 211/26 |
| 5,363,613 | 11/1994 | Sevier | 52/263 |
| 5,372,262 | 12/1994 | Benson et al. | 211/26 |
| 5,380,083 | 1/1995 | Jones et al. | 312/265.3 |
| 5,441,337 | 8/1995 | Mazura et al. | 312/265.5 |
| 5,542,549 | 8/1996 | Siemon et al. | 211/26 |
| 5,639,150 | 6/1997 | Anderson et al. | 312/265.3 |
| 5,664,380 | 9/1997 | Hsueh | 52/126.4 |

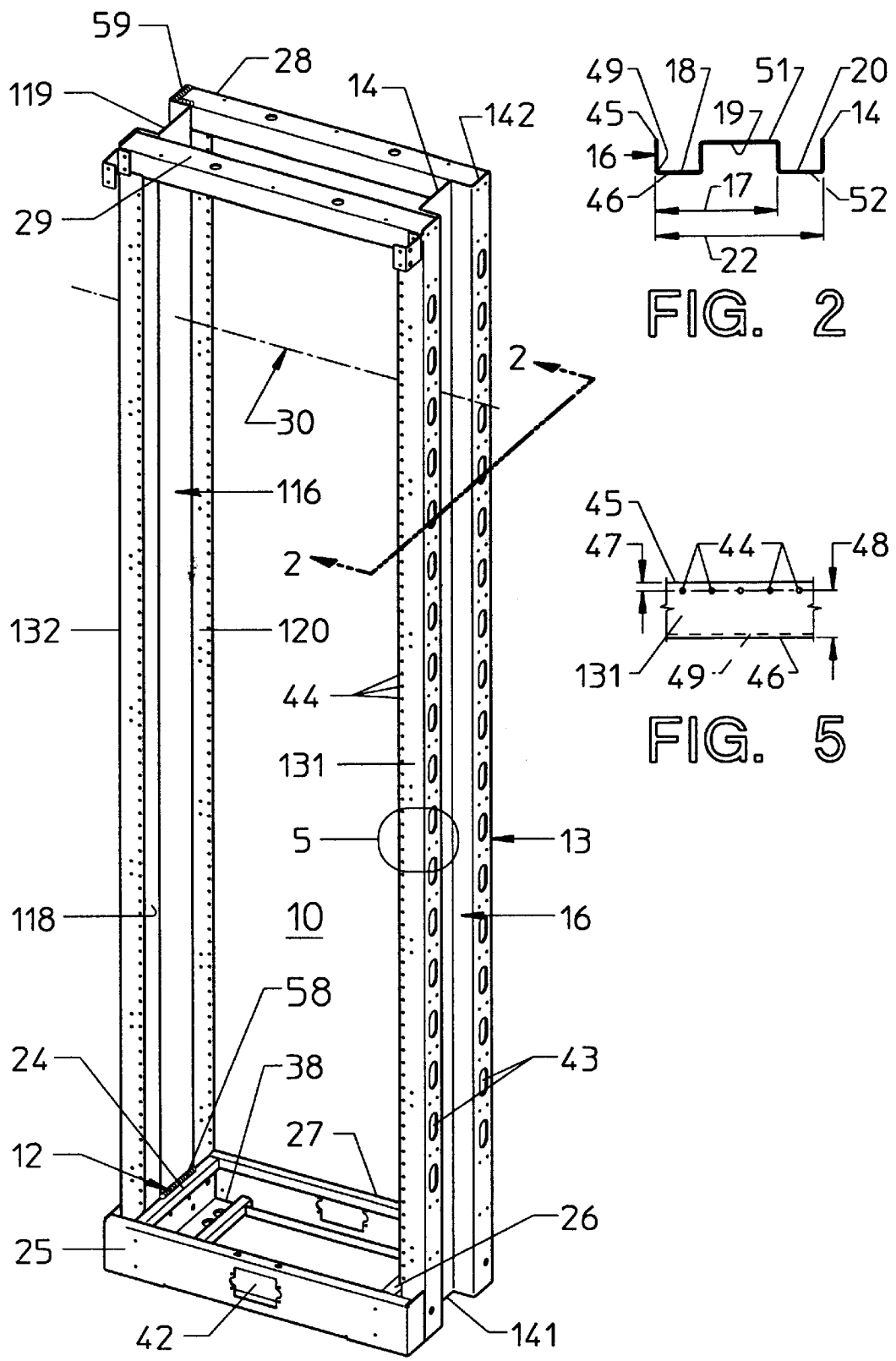

EQUIPMENT RACK SYSTEM

CROSS-REFERENCE

This is a continuation-in-part of the now abandoned U.S. patent application Ser. No. 08/868,291, filed Jun. 3, 1997, by Richard W. Sevier, assigned to the assignee of the entire interest hereof, and hereby incorporated by reference herein.

FIELD OF THE INVENTION

The subject invention relates to rack systems for electronic and other equipment and, more specifically, to methods for making electronic equipment and other racks and to equipment racks and cabinets made by such methods or otherwise.

BACKGROUND OF THE INVENTION

Electronic equipment racks are well known for use in telecommunication, including telephony, in electronic data processing or control, and in many other fields.

There are ongoing efforts to evolve electronic and other equipment racks that are susceptible to industry-wide standardization or that are compatible with standardized or recurring environments, and/or that are highly resistant t:o earthquakes and other calamities.

SUMMARY OF THE INVENTION

It is a general object of the invention to provide improved equipment racks and cabinets and to provide improved methods for making equipment racks.

It is a geraane object of the invention to provide versatile equipment racks and cabinets that comply with requirements of standardization or that otherwise fit standard or recurring environments.

It is a related object of the invention to provide earthquake-aresistant equipment racks and cabinets.

The invention resides in a method of making an equipment rack having horizontal frame structure, and including vertical frame structure made of sheet material, secured to that horizontal frame structure and having a bent cross-section and opposite ends. The method according to the invention imposes on such sheet material a square-wave configuration as that bent cross-section composed of alternate first, second and third square half-cycle configurations in one piece presenting three substantially flat and mutually spaced crests, extending the horizontal frame structure into more than one of the square half-cycle configurations and along the substantially flat crests of the latter square half-cycle configurations in overlapping relationship with the vertical frame structure substantially for the widths of the latter crests and for corresponding heights of the horizontal and vertical frame structures, and intimately interconnecting the horizontal and vertical frame structures along the above mentioned opposite ends and at all overlapping portions of the horizontal and vertical frame structures.

From a related aspect thereof, the invention resides in a method of making an equipment rack having horizontal frame structure, and a pair of spaced vertical frame members each made of sheet material secured to the horizontal frame structure and each having a bent cross-section and opposite ends. The method according to this aspect of the invention imposes on the sheet material of each pair of spaced vertical frame members a square-wave configuration as the bent cross-section composed of alternate first, second and third square half-cycle configurations presenting three substantially flat and mutually spaced crests, extends the horizontal frame structure into more than one of the square half-cycle configurations of each pair of spaced vertical frame members and along the substantially flat crests of the latter square half-cycle configurations in overlapping relationship with each pair of spaced vertical frame members substantially for the widths of the latter crests and for corresponding heights of the horizontal frame structure and pair of spaced vertical frame members, and intimately interconnects the horizontal frame structure and pair of vertical frame members along the above mentioned opposite ends and at all overlapping portions of the horizontal frame structure and pair of vertical frame members.

The invention resides also in an equipment rack comprising horizontal frame structure, and vertical frame structure of sheet material, secured to that horizontal frame structure and having a bent cross-section and opposite ends, comprising a square-wave configuration as the bent cross-section having alternate first, second and third square half-cycle configurations in one piece presenting three substantially flat and mutually spaced crests. The horizontal frame structure extends into more than one of these square half-cycle configurations and along the substantially flat crests of the latter square half-cycle configurations in overlapping relationship with the vertical frame structure substantially for the widths of the crests and for corresponding heights of the horizontal and vertical frame structures, and the horizontal and vertical frame structures are intimately interconnected along the above mentioned opposite ends and at all overlapping portions of the horizontal and vertical frame members.

From a related aspect thereof, the invention resides in an equipment rack having horizontal frame structure, and a pair of spaced vertical frame members each made of sheet material secured to the horizontal frame structure and each having a bent cross-section and opposite ends, comprising a square-wave configuration as the bent cross-section of each of the pair of spaced vertical frame members including alternate first, second and third square half-cycle configurations presenting three substantially flat and mutually spaced crests. The horizontal frame structure extends into more than one of the square half-cycle configurations of each pair of spaced vertical frame members and along the substantially flat crests of the latter square half-cycle configurations in overlapping relationship with each pair of spaced vertical frame members substantially for the widths of the latter crests and for corresponding heights of the horizontal frame structure and pair of spaced vertical frame members, and the horizontal frame structure and pair of vertical frame members are intimately interconnected along the above mentioned opposite ends and at all overlapping portions of the horizontal frame structure and pair of vertical frame members.

BRIEF DESCRIPTION OF THE DRAWINGS

The subject invention and its various aspects and objects will become more readily apparent from the following detailed description of preferred embodiments thereof, illustrated by way of example in the accompanying drawings which also constitute a written description of the invention, wherein like reference numerals designate like or equivalent parts, and in which:

FIG. 1 is a perspective view of an equipment rack according to an embodiment of the invention;

FIG. 2 is a section taken on the line 2—2 in FIGS. 1, 6 and 7 showing on an enlarged scale a square-wave configuration of vertical frame members according to an embodiment of the invention;

FIG. 5 is an enlarged detail view taken in the segment 5 of FIG. 1;

DESCRIPTION OF PREFERRED EMBODIMENTS

Figure 3:
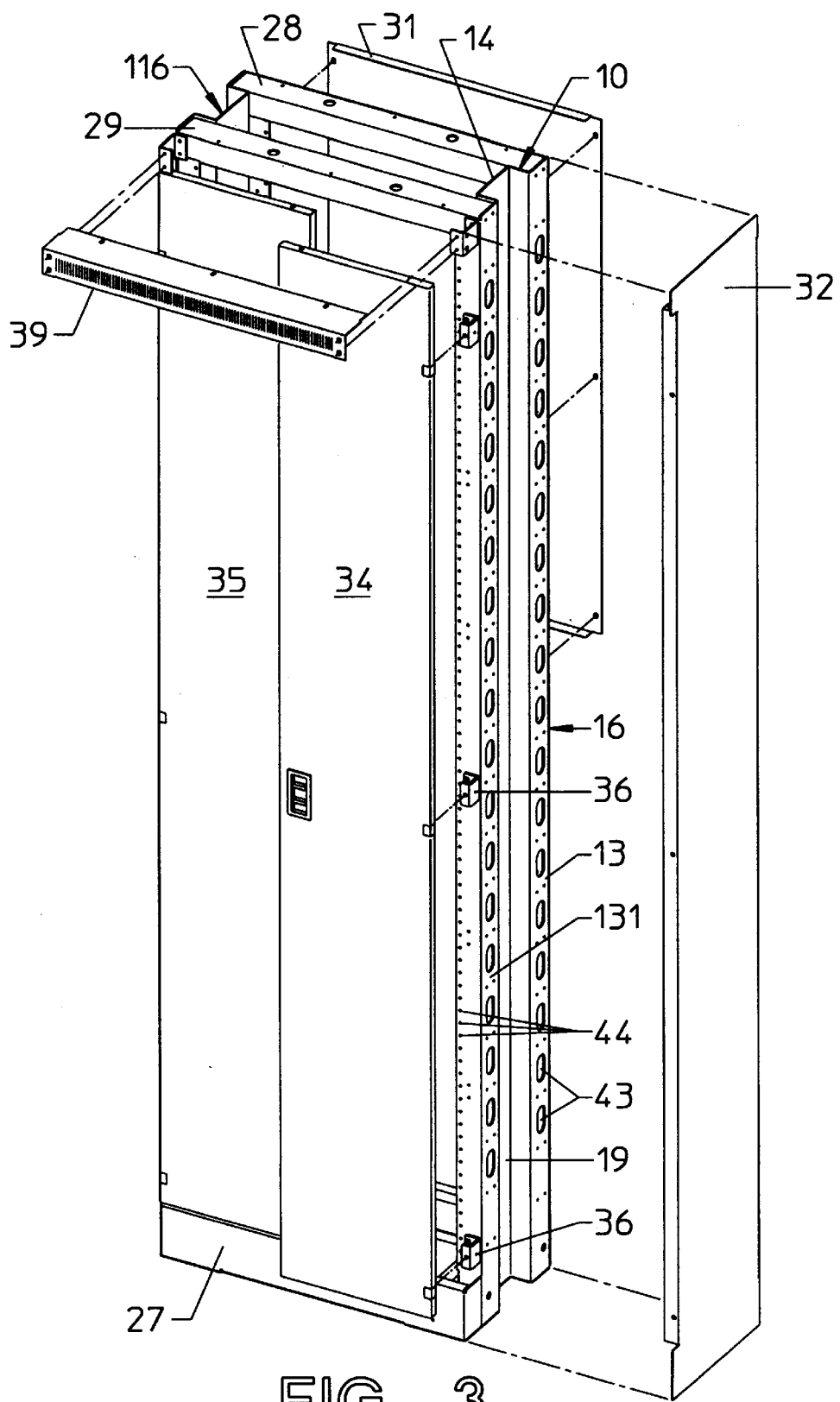
FIG. 3 is an exploded perspective view of an equipment cabinet including the equipment rack according to an embodiment of the invention.

The drawings illustrate methods of making equipment racks and show equipment racks and cabinets according to embodiments of the invention.

In this respect and in general, rack structures according to the invention or embodiments thereof are of wide utility, including facilities for mounting electrical and/or electronic equipment, facilities for mounting gas supply or transmission equipment, and facilities for mounting liquid fuel supply or transmission systems, or facilities for mounting fire-fighting equipment, hospital equipment and supplies, food and drink survival rations, and other articles, commodities and supplies needed for endurance of heavy earthquakes and other disasters, to name but a few examples where seismic stability and endurance are essential, especially in seismically active areas of the world.

As seen in FIGS. 1, 3, 4, 6 and 7, equipment racks 10, 100 and 200 have horizontal frame structure 12, and vertical frame structure 13 made of sheet metal or other sheet material 14, secured to the horizontal frame structure and having a bent cross-section, such as seen also in FIG. 2. Each vertical frame structure 13 has opposite ends, such as shown in FIG. 1 at 141 and 142 for the vertical frame member 131.

The method according to the invention imposes on the sheet material 14 a square-wave configuration 16 as the above mentioned bent cross-section composed of alternate first, second and third square half-cycle configurations 18, 19 and 20 in one piece presenting three substantially flat and mutually spaced crests 46, 51 and 52, such as shown in FIG. 2 for all illustrated embodiments. One period or cycle 17 of the square-wave configuration 16 of the bent cross-section is also seen in FIG. 2.

In this respect and in general, the expressions "square-wave", "period" or "Kcycle" and "square half-cycle" or "half-wave", "negative-going" or "negative" and "positive-going" or "positive" as herein employed to describe and define sheet material configurations, have been derived from the fields of electronics and data transmission which use similar terms to describe and define alternating-current square waves.

In this respect, a square wave may be thought of as a periodic wave that alternates between different values; often between two values. Even though square waves may be analyzed mathematically into sets of sine waves of very different frequencies, such as through a Fourier analysis, a square wave is not a sine wave. Unlike sine waves, which alternate between different values harmonically, square waves are characterized by a very short transition between values, as compared to the times at which the square wave dwells at either of the different values in succession during each alternating cycle. The shorter such transition, the closer the square wave comes to its ideal form. Such ideal form is seldom, if ever, realized in practice.

Likewise, as square waves in data transmission practically inevitably move within tolerances from the ideal form, so square-wave configurations according to the invention and its embodiments may deviate within tolerances from the shape of an ideal square-wave configuration. However, even then, the square waves according to the invention and its embodiments distinguish themselves from familiar trapezoidal waves that have deliberately sloped flanks.

As in alternating current terminology, the square-wave configuration may be thought of as going through cyczles of one period per cycle. Each period or cycle may be composed of a pair of oppositely-going half-cycles.

As indicated above, FIG. 2 shows a cycle 17 composed of a pair of alternate square half-cycle configurations 18 and 19. More specifically, FIG. 2 shows a first half-cycle 18 going in a first direction (an electrical engineer would say "negative-going" in the case of FIG. 2) followed by a second half-cycle 19 going in an opposite second direction (an electrical engineer would say "positive-going") for one full cycle 17.

In this respect, the parenthetical expressions "positive" and "negative" are relative terms; being relative to each other. In consequence, if section 2—2 were taken across the other vertical frame member 132, then the first and third half-cycles 118 and 120 might be considered "positive-going," while the second or intermediate half-cycle 119 might then be considered "negative-going."

Accordingly, in more general terms, it may be said that each cycle of the square-wave configuration 16, such as the cycle 17, is composed of, or comprises, a pair of oppositely-going half-cycles, such as shown at 18 and 19, or at 19 and 20, for that matter.

According to a preferred embodiment of the invention the alternate first, second and third square half-cycle configurations 18, 19 and 20 of the square-wave conf iguration 16 are given substantially like amplitudes, such as seen in FIG. 2. In practice, this provides an advantageous construction, especially for the sake of standardization, where equipment racks according to embodiments of the invention can be arranged intimately side by side for a unified or seismically sound assembly. Also, such equipment racks with vertical square-wave profiles of equal amplitude are more effectively provided in or with cabinet structures or other enclosures, than would be the case with racks wherein vertical square-wave profiles had unequal amplitudes, such as in the case of one square-wave configuration having an amplitude that exceeds the amplitude of adjacent square-wave configurations.

On the other hand, the square-wave configuration 16 preferalbly is composed of square half-cycle configurations 18, 19 and 20 of unequal widths. In this respect, "half-cycle" or "half-wave" does not mean fifty percent of a cycle 17, but rather refers to polarity or direction, such as "positive-going" or "negative-going" for instance, since either half-cycle may be longer than fifty percent, while the other half-cycle may be shorter than fifty percent, of the full cycle or period.

In practice, such inequality makes for increased versatility at remarkable strength. By way of example and not by way of limitation, one of the half-cycle configurations, such as the wider configuration 19, may be used as a wire or cable channel. Within the scope of the invention, either one or both half-cycle configurations 18 and 20 may also be used as wire or cable channels. However, according to an embodiment of the invention, at least one half-cycle configuration, such as the narrower configuration 18, may be used for mounting functions including joining racks to each other, such as back to back or side to side, or mounting various kinds of equipment, wiring and cabling onto the rack, or attaching panels or doors onto the rack, such as for making cabinets.

The invention imposes on the sheet material 14 one-and-one-half cycles 22 of the square-wave configuration 16 as the belt cross-section of the vertical frame structure 13 or member 131 and/or 132, such as for optimum strength, reversibility and other versatility. As mentioned above, the square-wave configuration 16 is composed of alternate first, second and third square half-cycle configurations 18, 19 and 20. The second square half-cycle configuration 19 preferably has or is given a width different from at least one of the first and third square half-cycle configurations 18 and 20. Preferably, the second or middle square half-cycle configuration 19 is made wider than the first and third square half-cycle configurations 18 and 20, such as to provide a wider cable channel at the middle of the vertical frame structure and/or to provide the vertical frame structure with a wider central surface area for such purposes as welding or otherwise intimately connecting horizontal frame structure 12, 24 or 26 to the vertical frame structure 13, 131 or 132.

A preferred embodiment of the invention makes the first and third square half-cycle configurations 18 and 20 equal in width, such as for equal strength at the front and rear of the equipment rack or cabinet and/or for front-and-back or other reversibility.

The invention extends the horizontal frame structure into more than one of the square half-cycle configurations 18 to 20 and along the substantially flat crests 46, 51 and 52 of the latter square half-cycle configurations in overlapping relationship with the vertical frame structure 13 substantially for the widths of the latter crests and for corresponding heights of the horizontal and vertical frame structures. By way of example, this is illustrated at each top of the rack 10, 100 and 200 in FIGS. 1, 3, 6 and 7, wherein horizontal frame structure, such as at 28, 29, is extended into two of the square half-cycle configurations, such as 18 and 20, and along substantially flat crests, such as 46 and 52, of such two square half-cycle configurations in overlapping relationship with the vertical frame structure 13 or 131 and 132 substantially for the widths of the latter crests and for corresponding heights of these horizontal and vertical frame structures. These horizontal and vertical frame structures 12 and 13, etc., are intimately interconnected at overlapping portions of such horizontal and vertical frame structures at the two square half-cycle configurations, such as at 18 and 20.

Within the scope of the invention, the horizontal and vertical frame structures 12 and 13, etc., are intimately interconnected along the opposite ends 141 and 142 of the vertical frame structure and at all overlapping portions of such horizontal and vertical frame structures.

According to illustrated embodiments of the invention, the horizontal frame structure 12 includes spaced horizontal frame members 28 and 29 extending respectively into two square half-cycle configurations 18 and 20 and along substantially flat crests 46 and 52 of these two square half-cycle configurations in overlapping relationship with the vertical frame structure 13 substantially for the widths of the latter crests and for corresponding heights of these horizontal frame members 28 and 29 and the vertical frame structure, such as at 131 and 132.

For optimum strength and seismic integrity, these horizontal frame members 28 and 29 and vertical frame structure 13 or 131 and 132 are intimately interconnected at overlapping portions of these horizontal frame members and vertical frame structure at the two square half-cycle configurations 18 and 20.

According to a preferred embodiment of the invention, the horizontal frame structure 12 is intimately connected to the vertical frame structure 14 along another one of the square half-cycle configurations, such as along the crest 51 of the second square half-cycle configuration 19 as seen at the bottom of FIG. 1 relative to the reference numerals in FIG. 2. The horizontal frame structure 12 preferably is so connected to the vertical frame structure 14 along that other one of the square half-cycle configurations in overlapping relationship with that vertical frame structure substantially for the width of that other square half-cycle and for corresponding heights of these horizontal and vertical frame structures. By way of example, reference may be had to the bottom of FIG. 1, where a horizontal frame member 24 is seen as overlapping the vertical frame member 132 for the height of that horizontal frame member.

Within the scope of the invention, horizontal frame structure 12 preferably is intimately connected to vertical frame structure 13 at all three of the crests designated by reference numerals 46, 51 and 52 in FIG. 2. In the embodiment of FIG. 1, for instance, this is realized by connecting vertical frame structure 13 or each of the vertical frame members 131 and 132 to the or each second or central crest 51 at the bottom of the rack 10 and to or at crests 46 and 52 at the top of that rack 10. That is also the case in the embodiments of FIGS. 6 and 7, wherein the entire cross-section of each vertical frame member 131 and 132 is connected to the base 12 at the bottom of racks 100 and 200 along each square-wave configuration 16, including square half-cycle configurations 18, 19 and 20 with crests 46, 51 and 52.

According to an embodiment of the invention, the horizontal frame structure is extended into first and third square half-cycle configurations 18 and 20 and along substantially flat crests 46 and 52 of these first and third square half-cycle configuirations in overlapping relationship with the vertical frame structure 13 substantially for the widths of the latter crests 46 and 52 and for corresponding heights of the horizontal and vertical frame structures. Such horizontal and vertical frame structures are intimately interconnected at overlapping portions of these horizontal and vertical frame structures at such first and third square half-cycle configurations 18 and 20.

According to preferred embodiments of the invention, the horizontal frame structure 12 includes spaced horizontal frame members, such as shown at 28 and 29 in FIGS. 1, 3, 4, 6 and 7, extending respectively into first and third square half-cycle configurations 18 and 20 and along substantially flat crests 46 and 52 (see FIG. 2) of these first and third square half-cycle configurations in overlapping relationship with vertical frame structure 13 substantially for the widths of the latter crests and for corresponding heights of such horizontal frame members and vertical frame structure. Such horizontal frame members and vertical frame structure are intimately interconnected at overlapping portions of these horizontal frame members and vertical frame structure at first and third square half-cycle configurations 18 and 20, for example.

Figure 6:
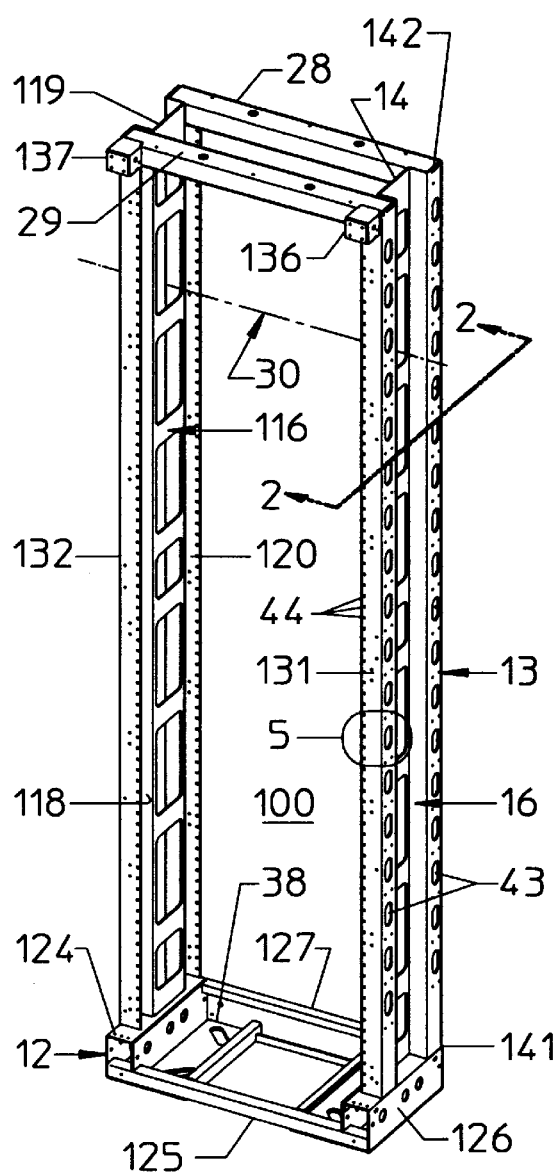
FIG. 6 is a perspective view similar to FIG. 1, of an equipment rack pursuant to a further embodiment of the invention.
Figure 7:
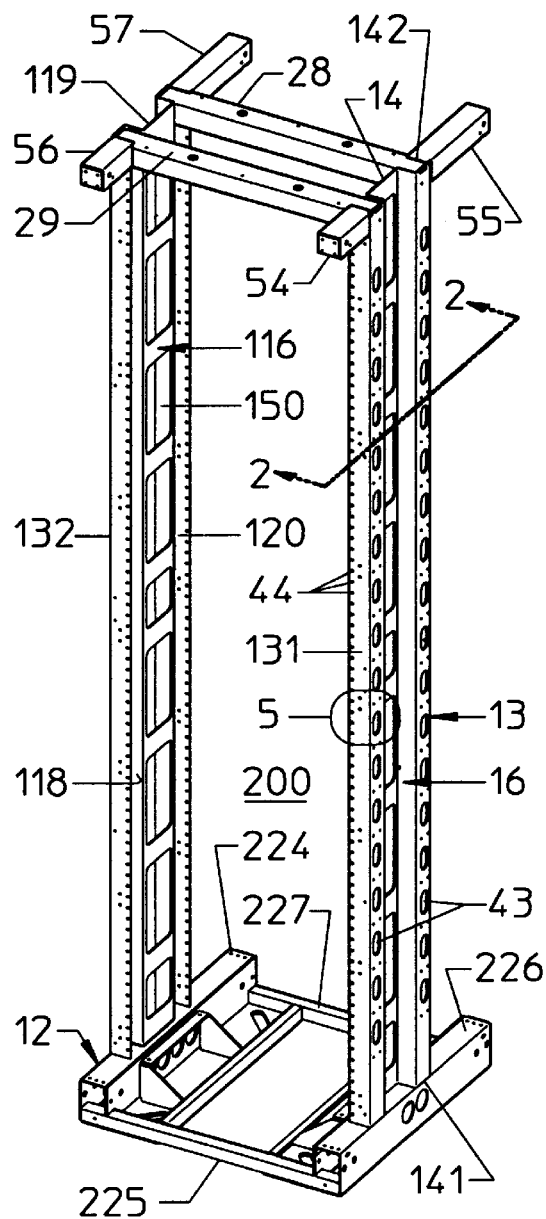
FIG. 7 is a perspective view similar to FIG. 1, of an equipment rack pursuant to yet another embodiment of the invention.

The horizontal frame structure 12 also may be intimately connected to the vertical frame structure 13 along the second square half-cycle configuration 19, such as seen at the bottoms of FIGS. 1, 6 and 7. As specifically shown in the embodiment of FIG. 1, horizontal frame structure 12 is intimately connected to vertical frame structure 13 along second square half-cycle configuration 19 in overlapping relationship with such vertical frame structure substantially for the width of that second square half-cycle and for corresponding heights of these horizontal and vertical frame structures, such as including the height of a horizontal frame member 24, for instance.

According to preferred embodiments of the invention, the horizontal frame structure 12 is composed of a base structure at one of the opposite ends 141 and 142 of the vertical frame structure 13 and a top structure at the other one of such opposite ends of the vertical frame structure, and such base structure and top structure jointly are intimately connected to all three of the crests 46, 51 and 52 of each square-wave configuration 16. By way of example, the drawings show examples of such horizontal base structures at 24, 25, 26 and 27, at 124, 125, 126 and 127, and at 224, 225, 226 and 227, and examples of such horizontal top structure at 28 and 29, at opposite ends 141 and 142, respectively of the vertical frame structure 13.

One of the base structure and the top structure, such as the top structure at 28 and 29, preferably extends into more than one of the square half-cycle configurations, such as into square half-cycle configurations 18 and 20, and along the substantially flat crests 46 and 52 of the latter square half-cycle configurations in overlapping relationship with the vertical frame structure 13 substantially for the widths of the latter crests and for corresponding heights of that one of the base structure and top structure, such as the top structure, and the vertical frame structure, such as seen at the top of FIGS. 1, 3, 4, 6 and 7, for example. Such top structure, or such one of the base structure and top structure, is intimately interconnected with the vertical frame structure 13 along overlapping portions of that top structure, or that one of the base structure and top structure, and the vertical frame structure. The other of the base structure and top structure, such as the base structure at 24 to 27, 124 to 127, or 224 to 227, is intimately connected to the vertical frame structure 13 at at least one of the crests 46, 51 and 52.

In this respect, the bottom of FIG. 1 shows an intimate interconnection of horizontal base member 24 to the second or central crest 51. FIGS. 6 and 7, on the other hand, show intimate interconnections of horizontal base members 124, 126, 224 and 226 along all three of the square half-cycle configurations 18, 19 and 20 of square-wave configurations 16 of the vertical frame members 131 and 132.

According to a preferred embodiment of the invention, the vertical frame structure comprises or is composed of a pair of spaced vertical frame members or uprights 131 and 132 each made of sheet material 14 secured to horizontal frame structure 12, and each of such vertical frame members has or is given a bent cross-section and opposite ends at 141 and 142. This embodiment of the invention imposes on sheet material 14 of each pair of spaced vertical frame members 131 and 132 a square-wave configuration 16 or 116 as bent cross-section composed of alternate first, second and third square half-cycle configurations 18, 19 and 20 or 118, 119 and 120, such as shown in FIGS. 1 and 2, presenting three substantially flat and mutually spaced crests 46, 51 and 52, such as seen in FIG. 2. The horizontal frame structure again is extended into more than one of these square half-cycle configurations of each pair of spaced vertical frame members and along the substantially flat crests of the latter square half-cycle configurations in overlapping relationship with each pair of spaced vertical frame members substantially for the widths of the latter crests and for corresponding heights of such horizontal frame structure and pair of spaced vertical frame members. The horizontal frame structure and pair of vertical frame members again are intimately interconnected along opposite ends 141 and 142 and at all overlapping portions of such horizontal frame structure and pair of vertical frame members.

The horizontal frame structure 12 may comprise or be composed of spaced horizontal frame members 24, 25, 26, 27, 28 and 23 having the pair of spaced vertical frame members 131 and 132 extending therebetween. In other words, the pair of spaced vertical frame members 131 and 132 may extend between the horizontal frame members and may be welded or otherwise intimately connected thereto.

For optimum structural strength, the horizontal frame structure is provided with or includes horizontal frame members, such as 28 and 29, extending into spaced cycles, such as 18 and 118, 20 and 120, of the square-wave configurations 16 and 116. According to a preferred embodiment of the invention, the pair of spaced frame members 28 and 29 extends into corresponding square half-cycles 18 and 118 and 20 and 120, respectively, of the square-wave configurations of vertical frame member 131 and 132. This may also provide optimum clearance for ventilation and/or cable ingress and egress. The cross members 28 and 29 may be in the form of U-shaped or other hollow cross channels or tubing for wire or cable channeling, such as between vertical frame members 131 and 132.

According to a preferred embodiment of the invention, the rack structure 10 or 100 is or is made substantially symmetrical with respect to a vertical plane through a center of the square-wave configuration 16 of one of the vertical frame member 131 and through a corresponding center of the square-wave configuration 116 of the other vertical frame member 132, such as symbolically shown by a phantom line 30 in FIGS. 1 and 6. This embodiment provides great versatility, including front-and-back reversibility of the rack 10 or 100 and expandability of the structure through interconnection of racks back to back. Such versatility may be enhanced by making the rack also symmetrical relative to a vertical plane spaced from and extending centrally between two vertical frame members 131 and 132.

Accordingly, embodiments of the subject invention provide racks 10 and 100 of uniform shapes or kinds that can be standardized for various purposes as industry-wide standard racks. One outstanding feature of embodiments of the subject invention is that it can be made to conveniently fit a certain pattern, such as the floor tile area of raised computer or cable flooring or the 600 mm×300 mm standard of the European Telecommunication Standards Institute [ETSI] that also has a 600 mm×600 mm standard which can easily be realized by doubling a rack structure according to an embodiment of the invention, or by connecting two 600 mm×300 mm racks back to back.

According to a preferred embodiment of the invention, the horizontal frame structure is composed of a base structure at one of the opposite ends 141 and 142 of the spaced vertical frame members 131 and 132, and a top structure at the other one of these opposite ends of the spaced vertical frame members. One of such base structure and top structure, such as the horizontal top structure 28, 29, extends into more than one of the square half-cycle configurations, such as into the square half-cycle configurations 18 and 20 and 118 and 120 of each pair of spaced vertical frame members 131 and 132 and along the substantially flat crests (see 46 and 52 in FIG. 2) of the latter square half-cycle configurations in overlapping relationship with each pair of spaced vertical frame members substantially for the widths of the latter crests and for corresponding heights of that one of the base structure and top structure and of the spaced vertical frame members 131 and 132.

One of the base structure and top structure is intimately interconnected with the spaced vertical frame members 131 and 132 along overlapping portions of one of such base structure and top structure and spaced vertical frame members, and the other of such base structure and top structure is intimately connected to the spaced vertical frame members at at least one of the crests of each vertical frame member.

According to an embodiment of the invention, both the base structure and the top structure may exceed each of the spaced vertical frame members in depth. By way of example, FIG. 7 shows a base structure 12 which at 224 and 226 exceeds each of the spaced vertical frame members 131 and 132 in depth. The embodiment of FIG. 7 also provides the horizontal top structure at each vertical frame member 131 and 132 with lateral or fore-and-aft extensions 54 and 55 and 56 and 57, respectively which exceed each of the spaced vertical frame members in depth. The overall depth of extensions 54 and 55 and of extensions 56 and 57 may be ecual to the depth of base members 226 and 224, respectively, for uniform overall structure which, for instance, may aid in the mounting of sheet metal and other panels, doors, and other parts of a cabinet structure.

The phrase "intimately interconnecting" and phrases of like import are repeatedly used herein to signify the provision or existence of intimate interconnections. While not limited to any particular technique, such interconnecting may comprise welding. Unfortunately, welds are not easily shown in drawings and when shown tend to degrade the quality of required clear and straight lines. Accordingly, in order to avoid crowding and degradation of the drawings, only some of the welds resulting from the required intimate interconnecting are shown, such as at 58 and 59 in FIG. 1. However, it is to be understood that welding or equivalent intimate interconnection of parts is intended wherever horizontal and vertical structure or structural members meet and where utmost seismic integrity is important.

For increased strength and for closure, a sheet material or rear panel may be connected to and extend between the vertical frame members 131 and 132, such as seen at 31 in FIG. 3.

Figure 4:
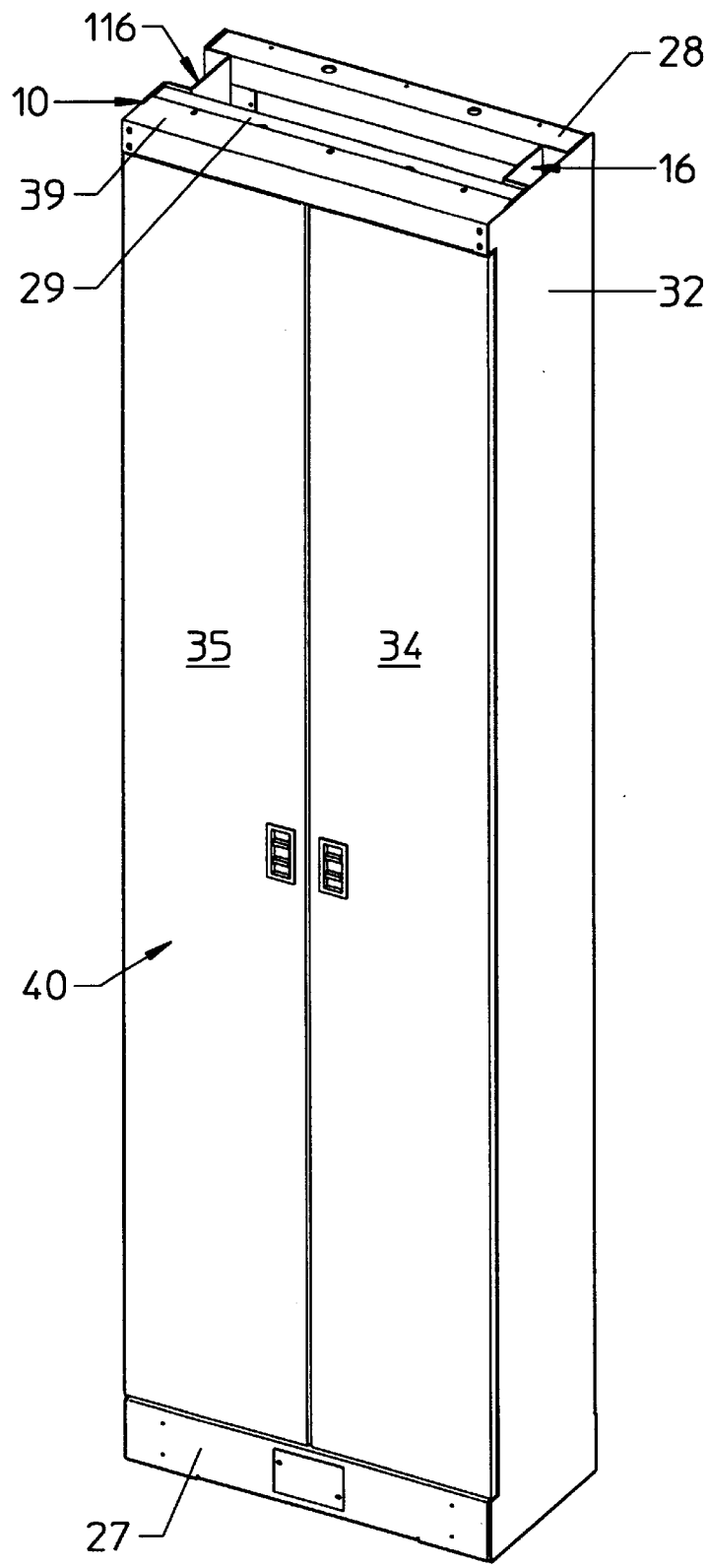
FIG. 4 is a perspective view of the assembled equipment cabinet pursuant to FIG. 3 and an embodiment of the invention.

Sheet material, such as in the form of a side panel 32, may cover at least one square half-cycle configuration of the vertical frame structure, such as the square half-cycle configuration or central channel 19. As seen in FIGS. 3 and 4, such side panel 32 may, however, cover the entire side of the vertical frame structure 13 or member 131.

Cabinet doors or door panels 34 and 35 or similar structure may be connected to the vertical frame structure 13, such as via hinges 36 attached to the vertical frame members 131 and 132, such as shown in FIG. 3 for instance. In this respect, FIGS. 3, 6 and 7 show door hinge standoffs at 36 and similar elements at 136 and 137 or 54 and 56 to permit wiring or cables to extend along the front of the rack 10 between that rack and a door 34 or 35, or to extend across the rear of the rack or between adjacent racks.

Standoffs or extensions 54 to 57 and 136 and 137 add structural integrity to the equipment racks and to resulting cabinet structures by interconnecting cabinet and door panels of the type shown at 31, 32, 34 and 35 in a firm manner with vertical and horizontal frame members.

Horizontal frame members 24 and 26 in the embodiment of FIG. 1 and similar structure in the embodiments of FIGS. 6 and 7 may constitute or be part of a base 38 of the rack structure 10, 100 or 200 and may be in the form of base angles 24 or 26 and similar structure.

One of the horizontal members, such as member 25, 125 or 225, may serve as or be a base front and may be duplicated or approximated for symmetry, such as for a base rear 27, 127 or 227. The rack may be bolted to concrete and other floors at base 38 or base angles 24 and 26.

Covers and trimmings may be added, such as shown at 39 in FIGS. 3 and 4. Vents may be provided as desired, such as in horizontal frame member 25 and 27 and/or in the cover 39 or in panels 31 or 32 and/or in doors 34 and 35, for instance. Cutouts for one or more electrical devices may be provided in horizontal frame members, such as shown at 42 in FIG. 1, and/or may be provided in the upper cover 39.

FIG. 4 shows a uniform cabinet 40 according to a preferred embodiment of the invention, that may be standardized for use in telephone exchanges or in many other plants, installations or situations; being extremely versatile and efficient, not only internally, but with respect to all four of its sides.

For instance, the doors 34 and 35 and their hinges or hinge standoffs 36, 54, 56, 136 and 137 can easily be mounted at the outer flanges of the square half-cycles 18 and 118 or 20 and 120. Conversely, stiffening and closure panels of the type shown in FIG. 3 at 31 can be mounted on the outer or front flanges of the half-cycles 18 and 118 instead of doors.

FIGS. 1, 3, 6 and 7 show lateral openings 43 in the vertical frame structure 16, such as in the bottoms or extremes of square half-cycle configurations 18 and 20, for such purposes as wiring or cabling.

FIGS. 1, 3, 5, 6 and 7 show a series of mounting holes 44. In practice, such mounting holes may be internally threaded or tapped for such purposes as mounting equipment, components, wires or cables. According to a preferred embodiment of the invention, the mounting holes 44 are remote from any bend in the square-wave configuration 16 or 116. Mounting holes 44 are closer to the free edge 45 of the square half-cycle configuration 18, than to the bottom 46 of that configuration, as may be seen from a comparison of the relatively short distance 47 of mounting holes 44 from the free edge 45 to the obviously several times larger distance 48 of these mounting holes from the bend 49 at half-cycle bottom 46. This not only improves accessibility from both ends of the mounting holes, but most importantly avoids weakening of the vertical frame structure by a large number of tapped holes at bend 49 or at any other bend of the vertical frame configuration 16 or 116.

The rack systems herein disclosed are characterized by high seismic integrity. The combinations of features set forth in the appendant claims permit variations within those parameters that adapt the equipment racks to various earthquake conditions and meet applicable industry standards and tests.

Where the natural frequency of conventional earthquake-resistant equipment racks has to exceed a certain value for a desired seismic resistance, equipment racks according to preferred embodiments of the invention may have natural frequencies below that value and still supply such seismic resistance doe to their superior strength.

In this respect and in general, holes or cutouts 150 may be provided in the vertical uprights or frame members 131 and 132 as cable slots and cabling holes and also in order to vary the natural frequency of the rack and resulting cabinet structure.

This extensive disclosure will render apparent or suggest to those skilled in the art various other modifications and variations within the spirit and scope of the invention.

I claim:

1. In a method of making an equipment rack having horizontal frame structure, and vertical frame structure made of sheet material, secured to said horizontal frame structure and having a bent cross-section and opposite ends, the improvement comprising in combination:

imposing on said sheet material a square-wave configuration as said bent cross-section composed of alternate first, second and third square half-cycle configurations in one piece presenting three substantially flat and mutually spaced crests;

extending said horizontal frame structure into more than one of said square half-cycle configurations and along the substantially flat crests of the latter square half-cycle configurations in overlapping relationship with said vertical frame structure substantially for the widths of the latter crests and for corresponding heights of said horizontal and vertical frame structures; and intimately interconnecting said horizontal and vertical frame structures along said opposite ends and at all overlapping portions of said horizontal and vertical frame structures.

2. A method as in claim 1, wherein:
said intimately interconnecting comprises welding.

3. A method as in claim 1, wherein:
said horizontal frame structure is intimately connected to said vertical frame structure at all three of said crests.

4. A method as in claim 1, wherein:
said horizontal frame structure is extended into two of said square half-cycle configurations and along substantially flat crests of said two square half-cycle configurations in overlapping relationship with said vertical frame structure substantially for the widths of the latter crests and for corresponding heights of said horizontal and vertical frame structures; and said horizontal and vertical frame structures are intimately interconnected at overlapping portions of said horizontal and vertical frame structures at said two square half-cycle configurations.

5. A method as in claim 4, wherein:
said horizontal frame structure includes spaced horizontal frame members extending respectively into said two square half-cycle configurations and along substantially flat crests of said two square half-cycle configurations in overlapping relationship with said vertical frame structure substantially for the widths of the latter crests and for corresponding heights of said horizontal frame members and vertical frame structure; and said horizontal frame members and vertical frame structure are intimately interconnected at overlapping portions of said horizontal frame members and vertical frame structure at said two square half-cycle configurations.

6. A method as in claim 4, wherein:
said horizontal frame structure is intimately connected to said vertical frame structure along another one of said square half-cycle configurations.

7. A method as in claim 4, wherein:
said horizontal frame structure is intimately connected to said vertical frame structure along another one of said square half-cycle configurations in overlapping relationship with said vertical frame structure substantially for the width of said other square half-cycle and for corresponding heights of said horizontal and vertical frame structures.

8. A method as in claim 4, wherein:
said horizontal frame structure is intimately connected to said vertical frame structure along all three of said square half-cycle configurations.

9. A method as in claim 1, wherein:
said horizontal frame structure is extended into said first and third square half-cycle configurations and along substantially flat crests of said first and third square half-cycle configurations in overlapping relationship with said vertical frame structure substantially for the widths of the latter crests and for corresponding heights of said horizontal and vertical frame structures; and said horizontal and vertical frame structures are intimately interconnected at overlapping portions of said horizontal and vertical frame structures at said first and third square half-cycle configurations.

10. A method as in claim 9, wherein:
said horizontal frame structure includes spaced horizontal frame members extending respectively into said first and third square half-cycle configurations and along substantially flat crests of said first and third square half-cycle configurations in overlapping relationship with said vertical frame structure substantially for the widths of the latter crests and for corresponding heights of said horizontal frame members and vertical frame structure; and said horizontal frame members and vertical frame structure are intimately interconnected at overlapping portions of said horizontal frame members and vertical frame structure at said first and third square half-cycle configurations.

11. A method as in claim 9, wherein:
said horizontal frame structure is intimately connected to said vertical frame structure along said second square half-cycle configuration.

12. A method as in claim 9, wherein:
said horizontal frame structure is intimately connected to said vertical frame structure along said second square half-cycle configuration in overlapping relationship with said vertical frame structure substantially for the width of said second square half-cycle and for corresponding heights of said horizontal and vertical frame structures.

13. A method as in claim 9, wherein:
said horizontal frame structure is intimately connected to said vertical frame structure along all three of said square half-cycle configurations.

14. A method as in claim 1, wherein:
said alternate first, second and third square half-cycle configurations are given substantially like amplitudes.

15. A method as in claim 1, wherein:
said first, second and third square half-cycle configurations are of unequal widths.

16. A method as in claim 1, wherein:
said second square half-cycle configuration is given a width different from at least one of said first and third square half-cycle configurations.

17. A method as in claim 1, wherein:
said second square half-cycle configuration is made wider than said first and third square half-cycle configurations.

18. A method as in claim 17, wherein:
said first and third square half-cycle configurations are made equal in width.

19. A method as in claim 1, wherein:
said horizontal frame structure is composed of a base structure at one of said opposite ends of said vertical frame structure, and a top structure at the other one of said opposite ends of said vertical frame structure; and
said base structure and said top structure jointly are intimately connected to all three of said crests.

20. A method as in claim 1, wherein:
said horizontal frame structure is composed of a base structure at one of said opposite ends of said vertical frame structure, and a top structure at the other one of said opposite ends of said vertical frame structure;
one of said base structure and said top structure extends into said more than one of said square half-cycle configurations and along the substantially flat crests of the latter square half-cycle configurations in overlapping relationship with said vertical frame structure substantially for the widths of the latter crests and for corresponding heights of said one of said base structure and said top structure and said vertical frame structure;
said one of said base structure and said top structure is intimately interconnected with said vertical frame structure along overlapping portions of one of said base structure and top structure and said vertical frame structure; and
the other of said base structure and said top structure is intimately connected to said vertical frame structure at at least one of said crests.

21. A method as in claim 20, wherein:
the other of said base structure and said top structure is intimately connected to said vertical frame structure along all three of said square half-cycle configurations.

22. A method as in claim 1, wherein:
said horizontal frame structure is composed of a base structure at one of said opposite ends of said vertical frame structure, and a top structure at the other one of said opposite ends of said vertical frame structure;
said top structure extends into said more than one of said square half-cycle configurations and along the substantially flat crests of the latter square half-cycle configurations in overlapping relationship with said vertical frame structure substantially for the widths of the latter crests and for corresponding heights of said top structure and vertical frame structure;
said top structure is intimately interconnected with said vertical frame structure along overlapping portions of top structure; and
said base structure is intimately connected to said vertical frame structure at at least one of said crests.

23. A method as in claim 22, wherein:
said base structure is intimately connected to said vertical frame structure along all three of said square half-cycle configurations.

24. In a method of making an equipment rack having horizontal frame structure, and a pair of spaced vertical frame members each made of sheet material secured to said horizontal frame structure and each having a bent cross-section and opposite ends, the improvement comprising in combination:
imposing on said sheet material of each pair of spaced vertical frame members a square-wave configuration as said bent cross-section composed of alternate first, second and third square half-cycle configurations presenting three substantially flat and mutually spaced crests,
extending said horizontal frame structure into more than one of said square half-cycle configurations of each pair of spaced vertical frame members and along the substantially flat crests of the latter square half-cycle configurations in overlapping relationship with each pair of spaced vertical frame members substantially for the widths of the latter crests and for corresponding heights of said horizontal frame structure and pair of spaced vertical frame members; and
intimately interconnecting said horizontal frame structure and pair of vertical frame members along said opposite ends and at all overlapping portions of said horizontal frame structure and pair of vertical frame members.

25. A method as in claim 24, wherein:
said intimately connecting comprises welding.

26. A method as in claim 24, wherein:
said horizontal frame structure is intimately connected to said pair of vertical frame members at all three of said crests.

27. A method as in claim 24, wherein:
said rack is made substantially symmetrical with respect to a vertical plane through a center of the square-wave configuration of one of said vertical frame members and through a corresponding center of the square-wave configuration of the other vertical frame member.

28. A method as in claim 24, wherein:
said horizontal frame structure is composed of a base structure at one of said opposite ends of said spaced vertical frame members, and a top structure at the other one of said opposite ends of said spaced vertical frame members;
one of said base structure and said top structure extends into said more than one of said square half-cycle configurations of each pair of spaced vertical frame members and along the substantially flat crests of the latter square half-cycle configurations in overlapping relationship with each pair of spaced vertical frame members substantially for the widths of the latter crests and for corresponding heights of said one of said base structure and said top structure and of said spaced vertical frame members;
said one of said base structure and said top structure is intimately interconnected with said spaced vertical frame members along overlapping portions of one of said base structure and top structure and said spaced vertical frame members; and
the other of said base structure and said top structure is intimately connected to said spaced vertical frame members at least one of said crests of each vertical frame member.

29. A method as in claim 28, wherein:
both said base structure and said top structure exceeds each of said spaced vertical frame members in depth.

30. A method as in claim, wherein:
said vertical frame structure is provided with a series of mounting holes remote from any bend of said square-wave configuration.

31. In an equipment rack having horizontal frame structure, and vertical frame structure of sheet material, secured to said horizontal frame structure and having a beat cross-section and opposite ends, the improvement comprising in combination:

a square-wave configuration as said bent cross-section having alternate first, second and third square half-cycle configurations in one piece presenting three substantially flat and mutually spaced crests;

said horizontal frame structure extending into more than one of said square half-cycle configurations and along said substantially flat crests of the latter square half-cycle configurations in overlapping relationship with said vertical frame structure substantially for the widths of the crests and for corresponding heights of said horizontal and vertical frame structures; and said horizontal and vertical frame structures intimately interconnected along said opposite ends and at all overlapping portions of the horizontal and vertical frame members.

32. An equipment rack as in claim 31, including:

welds intimately interconnecting said horizontal and vertical frame structures including said overlapping portions.

33. An equipment rack as in claim 31, including:

said horizontal frame structure intimately connected to said vertical frame structure at all three of said crests.

34. An equipment rack as in claim 31, wherein:

said horizontal frame structure extends into two of said square half-cycle configurations and along substantially flat crests of said two square half-cycle configurations in overlapping relationship with said vertical frame structure substantially for the widths of the latter crests and for corresponding heights of said horizontal and vertical frame structures;

said horizontal and vertical frame structures intimately interconnected at overlapping portions of said horizontal and vertical frame structures at said two square half-cycle configurations.

35. An equipment rack as in claim 31, wherein:

said horizontal frame structure includes spaced horizontal frame members extending respectively into said two square half-cycle configurations and along substantially flat crests of said two square half-cycle configurations in overlapping relationship with said vertical frame structure substantially for the widths of the latter crests and for corresponding heights of said horizontal frame members and vertical frame structure;

said horizontal frame members and vertical frame structure intimately interconnected at overlapping portions of said horizontal frame members and vertical frame structure at said two square half-cycle configurations.

36. An equipment rack as in claim 34, including:

said horizontal frame structure intimately connected to said vertical frame structure along another one of said square half-cycle configurations.

37. An equipment rack as in claim 34, including:

said horizontal frame structure intimately connected to said vertical frame structure along another one of said square half-cycle configurations in overlapping relationship with said vertical frame structure substantially for the width of said other square half-cycle and for corresponding heights of said horizontal and vertical frame structures.

38. An equipment rack as in claim 34, including:

said horizontal frame structure intimately connected to said vertical frame structure along all three of said square half-cycle configurations.

39. An equipment rack as in claim 31, wherein:

said horizontal frame structure extends into said first and third square half-cycle configurations and along substantially flat crests of said first and third square half-cycle configurations in overlapping relationship With said vertical frame structure substantially for the widths of the latter crests and for corresponding heights of said horizontal and vertical frame structures;

said horizontal and vertical frame structures intimately interconnected at overlapping portions of said horizontal and vertical frame structures at said first and third square half-cycle configurations.

40. An equipment rack as in claim 39, wherein:

said horizontal frame structure includes spaced horizontal frame members extending respectively into said first and third square half-cycle configurations and along substantially flat crests of said first and third square half-cycle configurations in overlapping relationship with said vertical frame structure substantially for the widths of the latter crests and for corresponding heights of said horizontal frame members and vertical frame structure;

said horizontal frame members and vertical frame structure intimately interconnected at overlapping portions of said horizontal frame members and vertical frame structure at said first and third square half-cycle configurations.

41. An equipment rack as in claim 39, including:

said horizontal frame structure intimately connected to said vertical frame structure along said second square half-cycle configuration.

42. An equipment rack as in claim 39, including:

said horizontal frame structure intimately connected to said vertical frame structure along said second square half-cycle configuration in overlapping relationship with said vertical frame structure substantially for the with of said second square half-cycle and for corresponding heights of said horizontal and vertical frame structures.

43. An equipment rack as in claim 39, including:

said horizontal frame structure intimately connected to said vertical frame structure along all three of said square half-cycle configurations.

44. An equipment rack as in claim 31, wherein:

said alternate first, second and third square half-cycle configurations have substantially like amplitudes.

45. An equipment rack as in claim 31, wherein:

said first, second and third square half-cycle configurations are of unequal widths.

46. An equipment rack as in claim 31, wherein:

said second square half-cycle configuration has a width different from at least one of said first and third square half-cycle configurations.

47. An equipment rack as in claim 31, wherein:

said second square half-cycle configuration is wider than said first and third square half-cycle configurations.

48. An equipment rack as in claim 47, wherein:

said first and third square half-cycle configurations are equal in width.

49. An equipment rack as in claim 31, wherein:

said horizontal frame structure includes a base structure at one of said opposite ends of said vertical frame structure, and a top structure at the other one of said opposite ends of said vertical frame structure;

said base structure and said top structure jointly intimately connected to all three of said crests.

50. An equipment rack as in claim 31, wherein:

said horizontal frame structure includes a base structure at one of said opposite ends of said vertical frame structure, and a top structure at the other one of said opposite ends of said vertical frame structure;

one of said base structure and said top structure extends into said more than one of said square half-cycle configurations and along the substantially flat crests of the latter square half-cycle configurations in overlapping relationship with said vertical frame structure substantially for the widths of the latter crests and for corresponding heights of said one of said base structure and said top structure and said vertical frame structure;

said one of said base structure and said top structure intimately interconnected with said vertical frame structure along overlapping portions of one of said base structure and top structure and said vertical frame structure; and the other of said base structure and said top structure intimately connected to said vertical frame structure at at least one of said crests.

51. An equipment rack as in claim 50, including:

the other of said base structure and said top structure intimately connected to said vertical frame structure along all three of said square half-cycle configurations.

52. An equipment rack as in claim 31, wherein:

said horizontal frame structure includes a base structure at one of said opposite ends of said vertical frame structure, and a top structure at the other one of said opposite ends of said vertical frame structure;

said top structure extends into said more than one of said square half-cycle configurations and along the substantially flat crests of the latter square half-cycle configurations in overlapping relationship with said vertical frame structure substantially for the widths of the latter crests and for corresponding heights of said top structure and vertical frame structure;

said top structure intimately interconnected with said vertical frame structure along overlapping portions of top structure; and said base structure intimately connected to said vertical frame structure at at least one of said crests.

53. An equipment rack as in claim 52, including:

said base structure intimately connected to said vertical frame structure along all three of said square half-cycle configurations.

54. In an equipment rack having horizontal frame structure, and a pair of spaced vertical frame members each made of sheet material secured to said horizontal frame structure and each having a bent cross-section and opposite ends, the improvement comprising in combination:

a square-wave configuration as said bent cross-section of each of said pair of spaced vertical frame members including alternate first, second and third square half-cycle configurations presenting three substantially flat and mutually spaced crests;

said horizontal frame structure extends into more than one of said square half-cycle configurations of each pair of spaced vertical frame members and along the substantially flat crests of the latter square half-cycle configurations in overlapping relationship with each pair of spaced vertical frame members substantially for the widths of the latter crests and for corresponding heights of said horizontal frame structure and pair of spaced vertical frame members; and said horizontal frame structure and pair of vertical frame members intimately interconnected along said opposite ends and at all overlapping portions of said horizontal frame structure and pair of vertical frame members.

55. An equipment rack as in claim 54, including:

welds intimately interconnecting said horizontal structure and pair of vertical frame members along said opposite ends and at all overlapping portions of said horizontal frame structure and pair of vertical frame members.

56. An equipment rack as in claim 54, including:

said horizontal frame structure intimately connected to said pair of vertical frame members at all three of said crests.

57. An equipment rack as in claim 54, wherein:

said rack is substantially symmetrical with respect to a vertical plane through a center of the square-wave configuration of one of said vertical frame members and through a corresponding center of the square-wave configuration of the other vertical frame member.

58. An equipment rack as in claim 54, wherein:

said horizontal frame structure includes a base structure at one of said opposite ends of said spaced vertical frame members, and a top structure at the other one of said opposite ends of said spaced vertical frame members;

one of said base structure and said top structure extends into said more than one of said square half-cycle configurations of each pair of spaced vertical frame members and along the substantially flat crests of the latter square half-cycle configurations in overlapping relationship with each pair of spaced vertical frame members substantially for the widths of the latter crests and for corresponding heights of said one of said base structure and said top structure and of said spaced vertical frame members;

said one of said base structure and said top structure intimately interconnected with said spaced vertical frame members along overlapping portions of one of said base structure and top structure and said spaced vertical frame members; and the other of said base structure and said top structure intimately connected to said spaced vertical frame members at at least one of said crests of each vertical frame member.

59. An equipment rack as in claim 58, wherein:

both said base structure and said top structure exceeds each of said spaced vertical frame members in depth.

60. An equipment rack as in claim 51, wherein:

said vertical frame structure has a series of mounting holes remote from any bend of said square-wave configuration.

\* \* \* \* \*